United States Patent
Kim et al.

(10) Patent No.: US 10,170,382 B2
(45) Date of Patent: Jan. 1, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Hyoung Joon Kim, Suwon-si (KR); Kyung Seob Oh, Suwon-si (KR); Kyoung Moo Harr, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/633,478

(22) Filed: Jun. 26, 2017

(65) Prior Publication Data

US 2018/0090402 A1    Mar. 29, 2018

(30) Foreign Application Priority Data

Sep. 29, 2016  (KR) .................. 10-2016-0125840

(51) Int. Cl.
*H01L 23/28*   (2006.01)
*H01L 23/053*  (2006.01)
(Continued)

(52) U.S. Cl.
CPC ............ *H01L 23/053* (2013.01); *H01L 23/24* (2013.01); *H01L 24/16* (2013.01); *H01L 2924/15174* (2013.01)

(58) Field of Classification Search
CPC . H01L 23/053; H01L 23/055; H01L 23/3128; H01L 23/5384; H01L 2924/3128; H01L 2924/5384; H01L 2924/151741
(Continued)

(56) References Cited

U.S. PATENT DOCUMENTS 6,114,763 A * 9/2000 Smith ............... H01L 21/563
                                                 257/692
8,941,225 B2 * 1/2015 Choi ................ H01L 25/50
                                                 257/686
(Continued)

FOREIGN PATENT DOCUMENTS

KR  10-2010-0099778 A   9/2010
KR  10-2013-0132162 A   12/2013
(Continued)

OTHER PUBLICATIONS

Office Action issued in corresponding Korean Patent Application No. 10-2016-0125840, dated Aug. 22, 2018.

*Primary Examiner* — Nitin Parekh
(74) *Attorney, Agent, or Firm* — McDermott Will & Emery LLP

(57) ABSTRACT

A fan-out semiconductor package includes: a first interconnection member having a through-hole; a semiconductor chip disposed in the through-hole, having an active surface having a connection pad disposed thereon and an inactive surface opposing the active surface, and having a protrusion bump disposed on the connection pad; an encapsulant encapsulating at least portions of the first interconnection member and the inactive surface of the semiconductor chip; and a second interconnection member disposed on the first interconnection member and the active surface of the semiconductor chip. In the fan-out semiconductor package, step portions of the protrusion bumps may be removed.

12 Claims, 18 Drawing Sheets

(51) Int. Cl.
*H01L 23/24* (2006.01)
*H01L 23/00* (2006.01)

(58) Field of Classification Search
USPC .......................................................... 257/787
See application file for complete search history.

(56) References Cited

U.S. PATENT DOCUMENTS

| | | | |
|---|---|---|---|
| 9,728,498 B2* | 8/2017 | Su | ................... H01L 25/105 |
| 2005/0161803 A1* | 7/2005 | Mihara | ............... H01L 23/5389 |
| | | | 257/698 |
| 2011/0062549 A1* | 3/2011 | Lin | .................... H01L 23/3128 |
| | | | 257/531 |
| 2013/0069239 A1* | 3/2013 | Kim | ................. H01L 23/49827 |
| | | | 257/774 |
| 2013/0127054 A1* | 5/2013 | Muthukumar | ...... H01L 23/3121 |
| | | | 257/738 |
| 2014/0077364 A1* | 3/2014 | Marimuthu | ............. H01L 24/13 |
| | | | 257/737 |
| 2014/0110856 A1 | 4/2014 | Lin | |
| 2016/0233166 A1 | 8/2016 | Teh et al. | |

FOREIGN PATENT DOCUMENTS

| | | |
|---|---|---|
| KR | 10-1536045 B1 | 7/2015 |
| KR | 10-2016-0024379 A | 3/2016 |

\* cited by examiner

I-I'

II-II'

US 10,170,382 B2

FAN-OUT SEMICONDUCTOR PACKAGE

CROSS-REFERENCE TO RELATED APPLICATION(S)

This application claims the benefit of priority to Korean Patent Application No. 10-2016-0125840 filed on Sep. 29, 2016 in the Korean Intellectual Property Office, the entire disclosure of which is incorporated herein by reference.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out semiconductor package. Such a fan-out semiconductor package has a compact size and may implement a plurality of pins by redistributing connection terminals outwardly of a region in which a semiconductor chip is disposed.

SUMMARY

An aspect of the present disclosure may provide a fan-out semiconductor package in which implementation of fine patterns is facilitated.

One of several solutions suggested through the present disclosure is to provide a fan-out semiconductor package in which step portions of protrusion bumps may be removed by a planarization process.

According to an aspect of the present disclosure, a fan-out semiconductor package includes: a first interconnection member having a through-hole; a semiconductor chip disposed in the through-hole, having an active surface having a connection pad disposed thereon and an inactive surface opposing the active surface, and having a protrusion bump disposed on the connection pad; an encapsulant encapsulating at least portions of the first interconnection member and the inactive surface of the semiconductor chip; a second interconnection member disposed on the first interconnection member and the active surface of the semiconductor chip; and a resin layer disposed between the encapsulant and the second interconnection member and contacting at least portions of side surfaces of the protrusion bump. The first interconnection member and the second interconnection member respectively include redistribution layers electrically connected to the connection pad of the semiconductor chip.

According to another aspect of the present disclosure, a fan-out semiconductor package includes: a first interconnection member having a through-hole; a semiconductor chip disposed in the through-hole, having an active surface having a connection pad disposed thereon and an inactive surface opposing the active surface, and having a protrusion bump disposed on the connection pad; an encapsulant encapsulating at least portions of the first interconnection member and side surfaces of the semiconductor chip; a second interconnection member disposed on the first interconnection member and the active surface of the semiconductor chip and having a redistribution layer electrically connected to the connection pad of the semiconductor chip; and a cover layer disposed on the encapsulant and covering the inactive surface of the semiconductor chip. The first interconnection member includes a first redistribution layer contacting the second interconnection member and a second redistribution layer contacting the cover layer, the first redistribution layer and the second redistribution layer are electrically connected to the connection pad of the semiconductor chip, and the first redistribution layer has a thickness smaller than that of the second redistribution layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
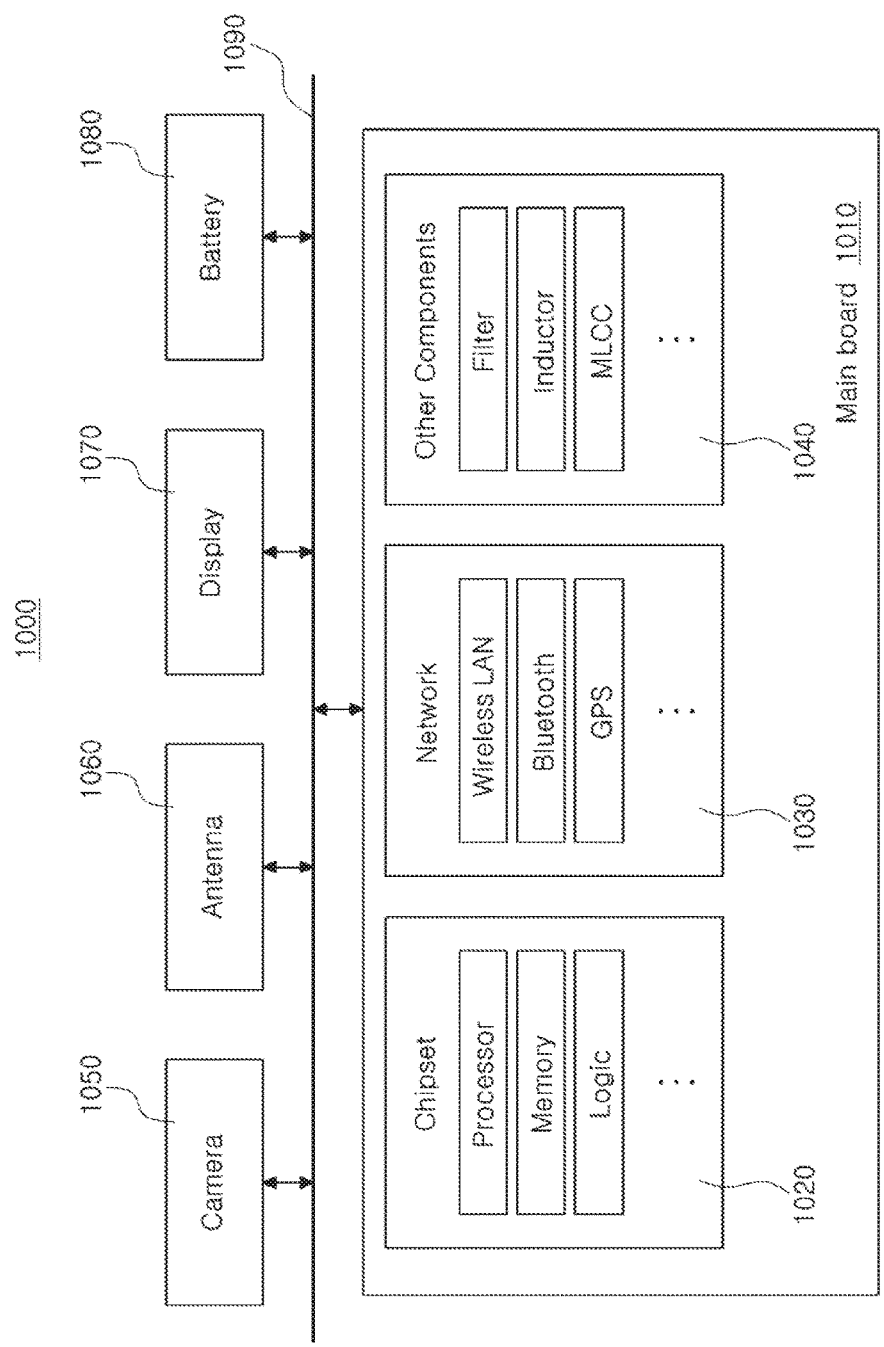
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip-related components. In addition, the chip-related components 1020 may be combined with each other.

The network-related components 1030 may be compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
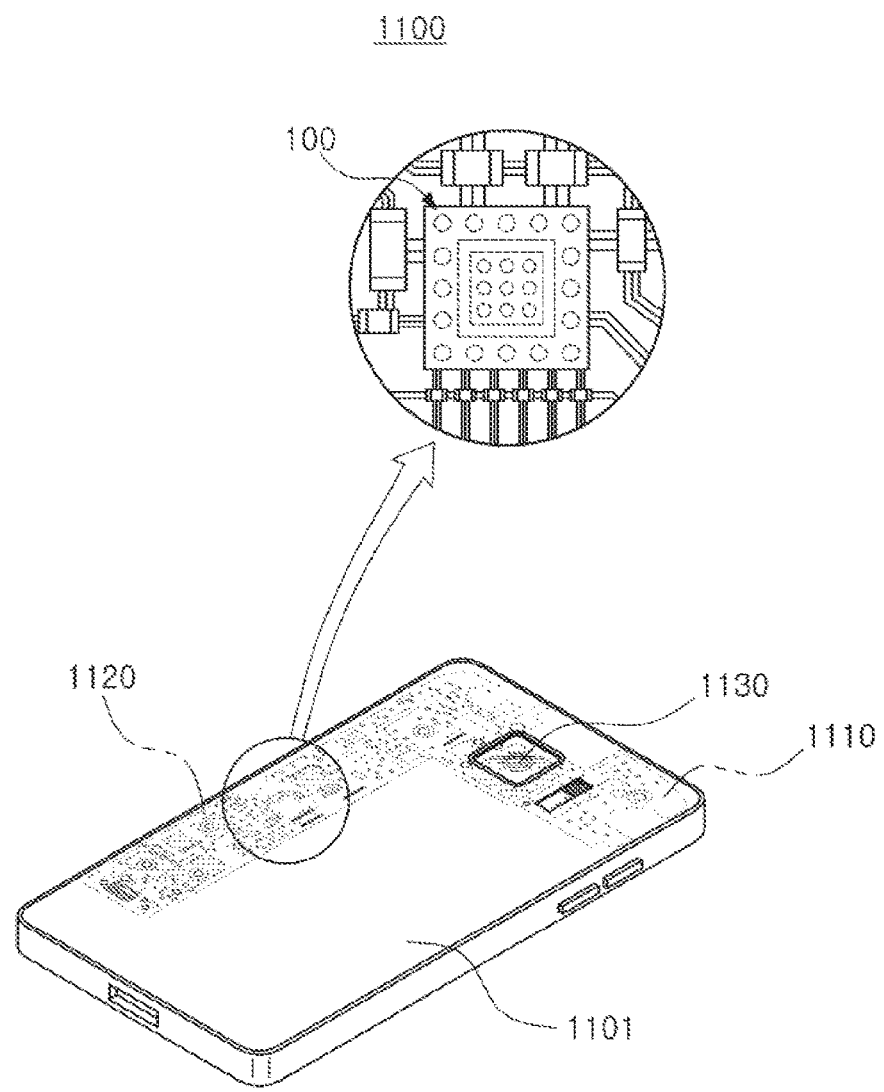
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it maybe difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3:
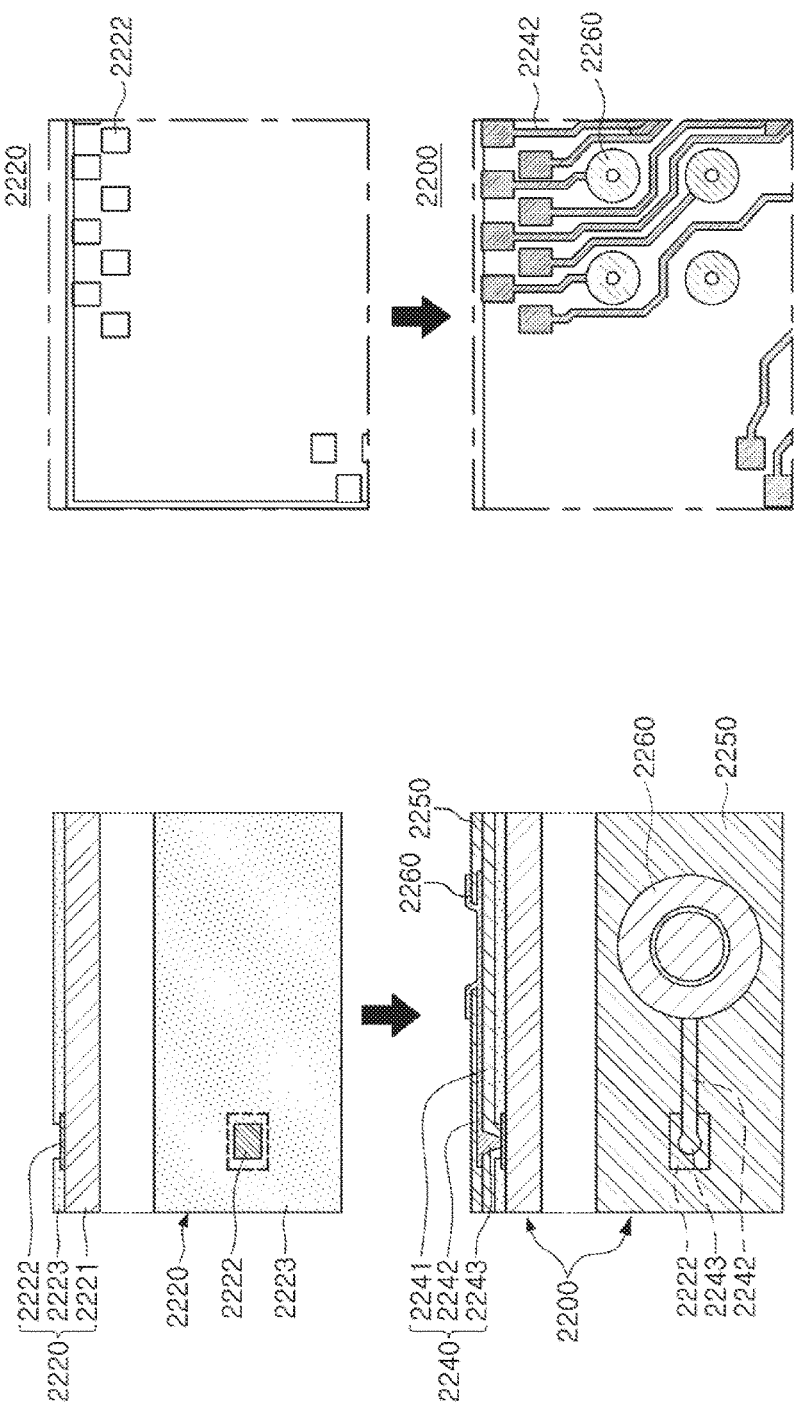
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
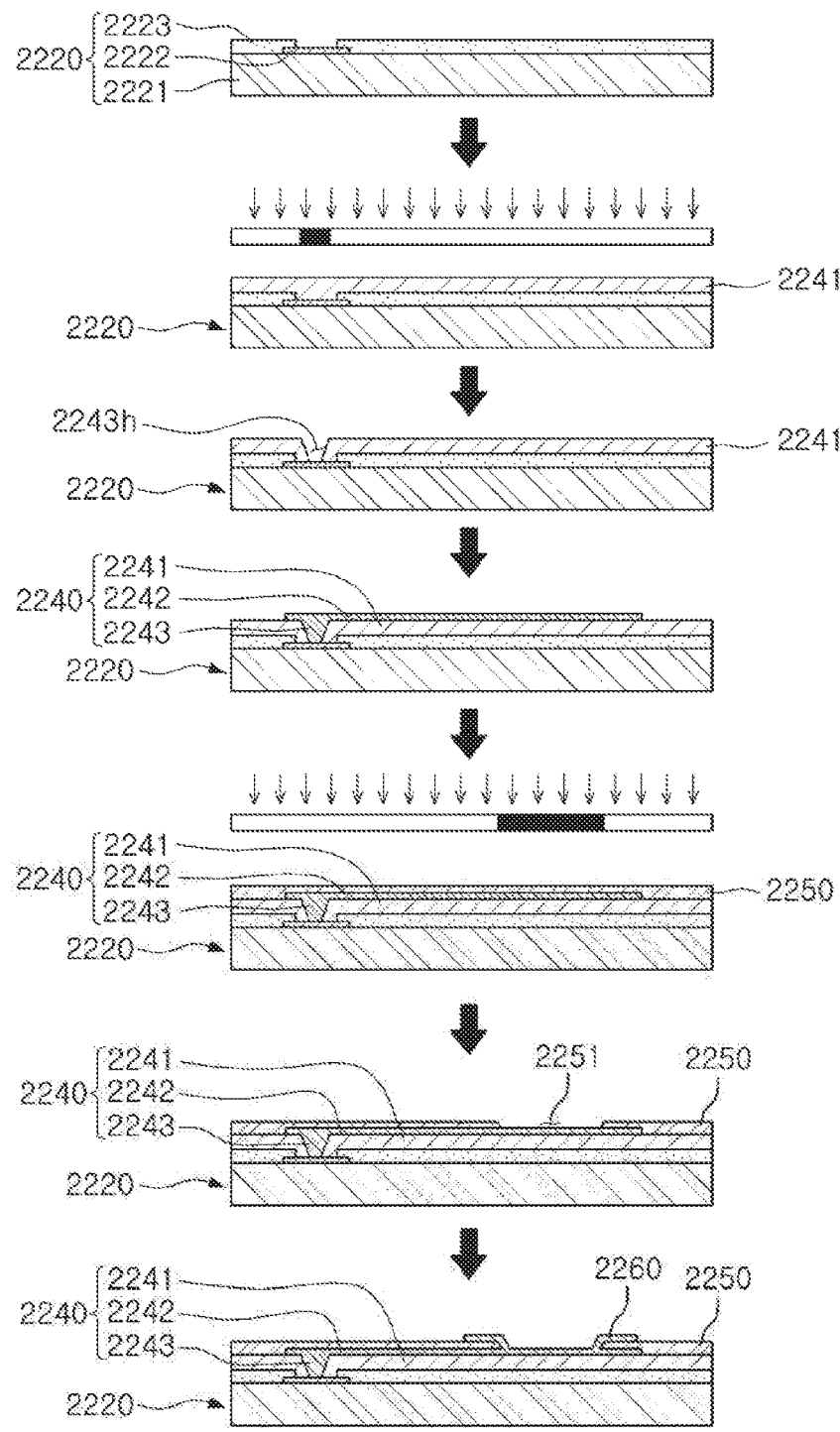
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2200 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed depending on a size of the semiconductor chip 2200 on the semiconductor chip 2220 in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2000 including, for example, the semiconductor chip 2200, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
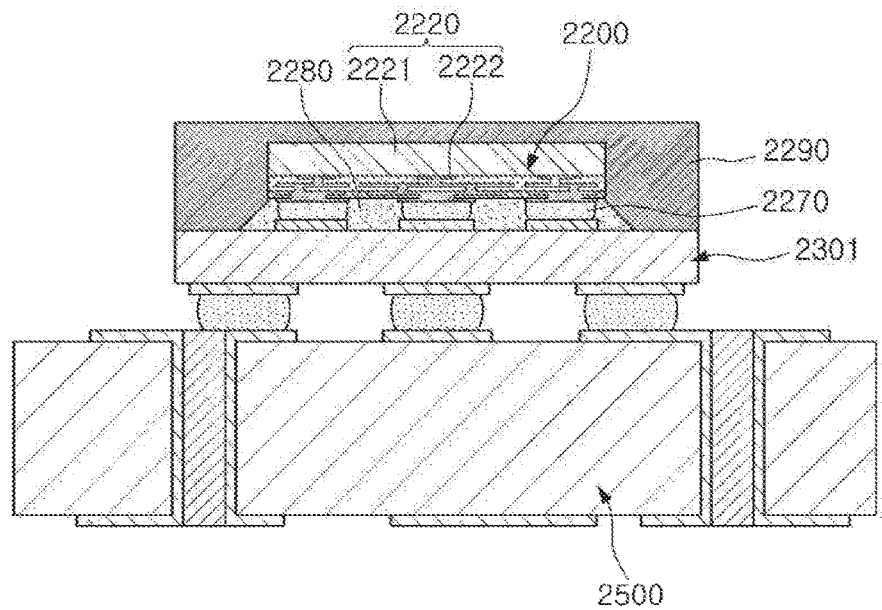
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
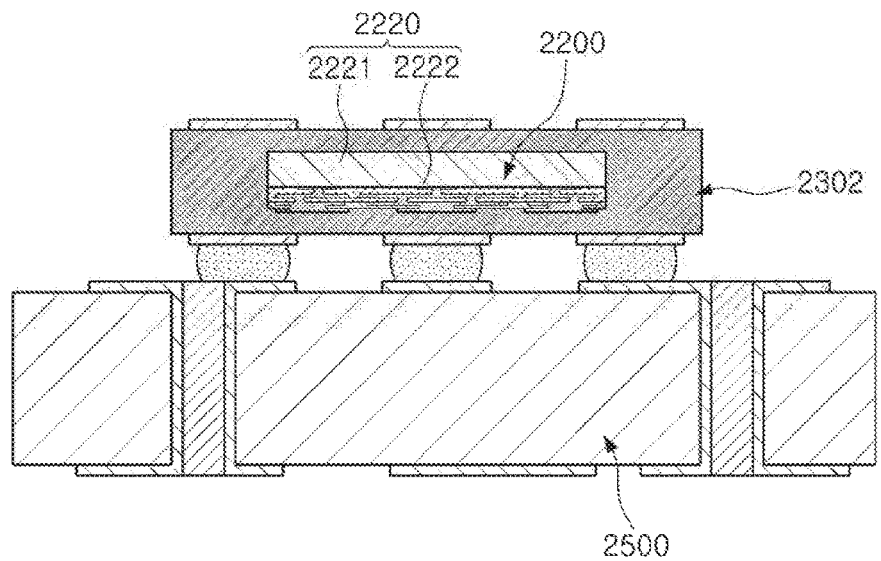
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2000, connection pads 2222, that is, I/O terminals, of a semiconductor chip 2200 may be redistributed through an interposer substrate 2301, and the fan-in semiconductor package 2000 may be ultimately mounted on a main board 2500 of an electronic device in a state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2000 may be embedded in a separate interposer substrate 2302, connection pads 2222, that is, I/O terminals, of the semiconductor chip 2200 may be redistributed by the interposer substrate 2302 in a state in which the fan-in semiconductor package 2000 is embedded in the interposer substrate 2302, and the fan-in semiconductor package 2000 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
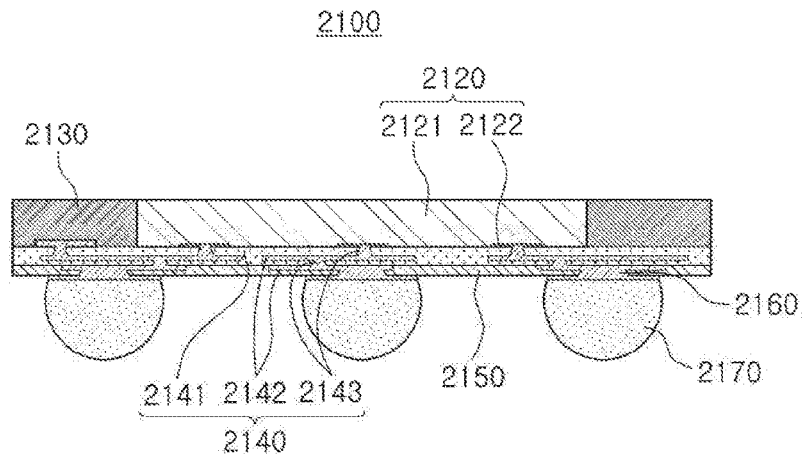
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may be formed on the interconnection member 2140, and under-bump metal layers 2160 may be formed in openings of the passivation layer 2150. Solder balls 2170 may be formed on the under-bump metal layers 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as it is, such that the fan-out semiconductor package may be mounted on the main board of the electronic device without using a separate interposer substrate, as described below.

Figure 8:
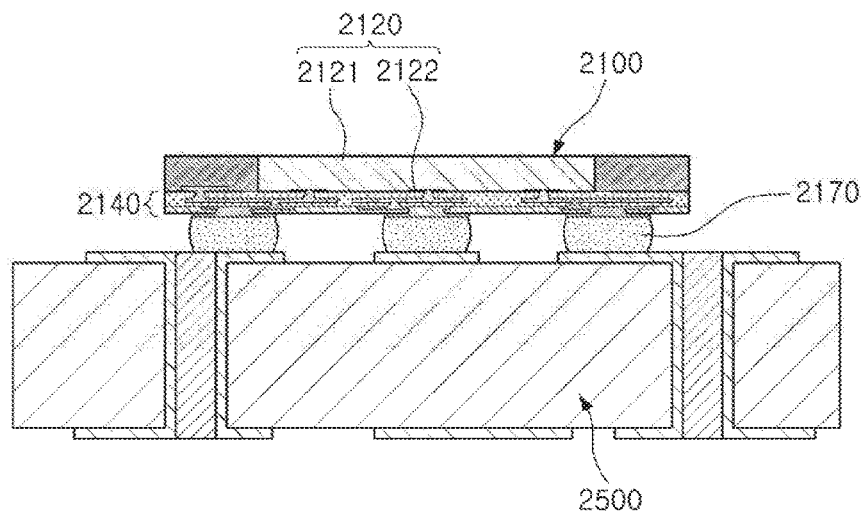
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which implementation of fine patterns is facilitated will hereinafter be described with reference to the drawings.

Figure 9:
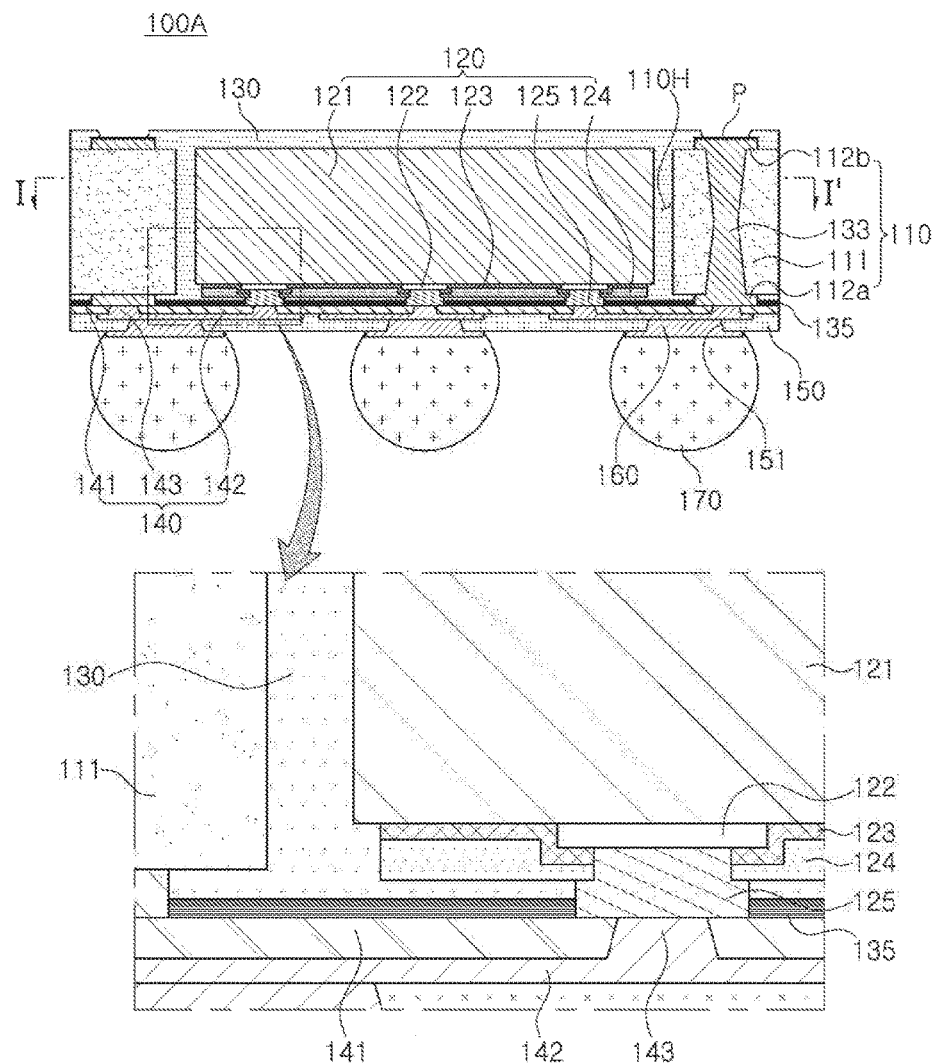
FIG. 9 is a schematic cross-sectional view illustrating an example of a fan-out semiconductor package.

FIG. 9 is a schematic cross-sectional view illustrating an example of a fan-out semiconductor package.

Figure 10:
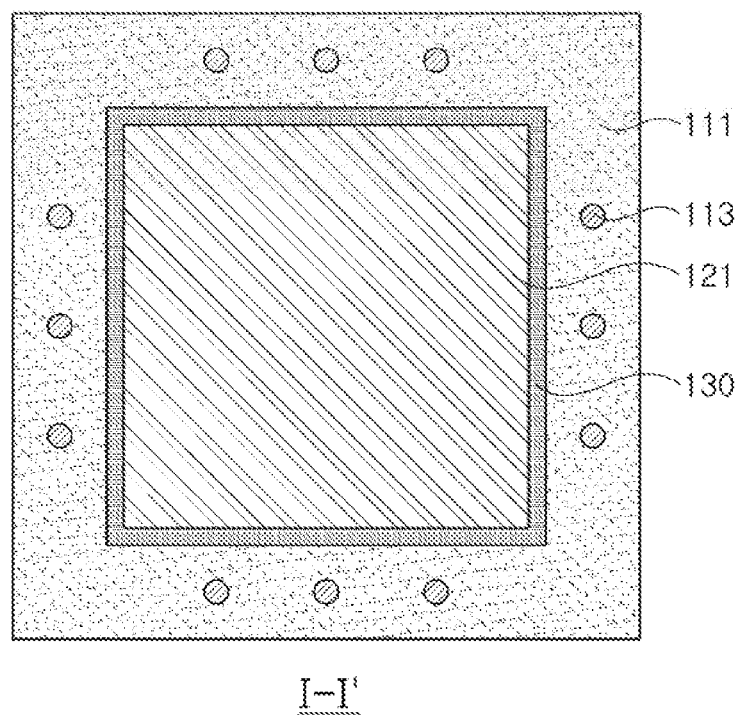
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110, having an active surface having connection pads 122 disposed thereon and an inactive surface disposed to oppose the active surface, and having protrusion bumps 125 disposed on the connection pads 122, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, and a resin layer 135 disposed between the encapsulant 130 and the second interconnection member 140 and contacting at least portions of side surfaces of the protrusion bumps 125. An interface between the second interconnection member 140 and the resin layer 135 and an interface between the second interconnection member 140 and the protrusion bump 125 may be present on levels corresponding to each other.

In premium application processors or flip-chip based devices that have been recently developed, fine pitches have been continuously required. To this end, it may be considered that structures of copper (Cu) pillars are used in a form of a final pad metal on connection pads. However, when a redistribution process is performed after a process of disposing a chip, difficulty may be generated in a redistribution forming process due to a step between the copper pillars.

On the other hand, the fan-out semiconductor package 100A according to the exemplary embodiment may include the resin layer 135 disposed between the encapsulant 130 encapsulating the semiconductor chip 120 and the second interconnection member 140 including a redistribution layer 142. The resin layer 135 may be disposed to planarize the protrusion bumps 125 disposed on the connection pads 122 of the semiconductor chip 120. Therefore, step portions of the protrusion bumps 125 may be removed, and difficulty in forming fine patterns in the redistribution forming process may thus be solved. As a result of the planarization, the resin layer 135 may contact at least portions of the side surfaces of the protrusion bumps 125. In addition, at least portions of a space between the second interconnection member 140 and the active surface of the semiconductor chip 120 may be filled with the resin layer 135 as well as the encapsulant 130. In addition, the interface between the second interconnection member 140 and the resin layer 135 and the interface between the second interconnection member 140 and the protrusion bump 125 may be present on the levels corresponding to each other. The meaning of "levels corresponding to each other" in the present disclosure includes a case in which levels are substantially the same as each other, that is, a case in which levels include an error in a process, as well as a case in which levels are the same as each other.

Meanwhile, the first interconnection member 110 may include an insulating layer 111, a first redistribution layer 112a disposed on the insulating layer 111 and contacting the second interconnection member 140, and a second redistribution layer 112b disposed on the other surface of the insulating layer 111 opposing one surface of the insulating layer 111 on which the first redistribution layer 112a is disposed. In this case, as a result of the planarization, the resin layer 135 may contact at least portions of side surfaces of the first redistribution layer 112a. In addition, at least portions of a space between the second interconnection member 140 and the insulating layer 111 may be filled with the resin layer 135 as well as the encapsulant 130. In addition, the interface between the second interconnection member 140 and the resin layer 135 and an interface between the second interconnection member 140 and the first redistribution layer 112a may also be present on levels corresponding to each other. Therefore, step portions between the protrusion bumps 125 and the first redistribution layer 112a may also be removed, and even in a case of forming redistributions up to a fan-out region, difficulty of a fine pattern forming process may be solved.

The respective components included in the fan-out semiconductor package 100A according to the exemplary embodiment will hereinafter be described below in more detail.

The first interconnection member 110 may include the redistribution layers 112a and 112b redistributing the connection pads 122 of the semiconductor chip 120 to thus reduce the number of layers of the second interconnection member 140. If necessary, the first interconnection member 110 may maintain rigidity of the fan-out semiconductor package 100A depending on materials of the first interconnection member 110, and serve to secure uniformity of a thickness of the encapsulant 130. In addition, due to the first interconnection member 110, the fan-out semiconductor package 100A according to the exemplary embodiment may be used as a portion of a package-on-package. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified into other forms, and the fan-out semiconductor package 100A may perform another function depending on such a form.

The first interconnection member 110 may include the insulating layer 111, the first redistribution layer 112a disposed on the insulating layer 111 and contacting the second interconnection member 140, and the second redistribution layer 112b disposed on the other surface of the insulating layer 111 opposing one surface of the insulating layer 111 on which the first redistribution layer 112a is disposed. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122. Although the first redistribution layer 112a is disposed on the insulating layer 111, the first redistribution layer 112a may be planarized by disposing the resin layer 135, such that step portions between the first redistribution layer 112a and the protrusion bumps 125 may not be substantially present.

A material of the insulating layer 111 is not particularly limited. For example, an insulating material may be used as the material of the insulating layer 111. In this case, a thermosetting resin such as an epoxy resin, a thermoplastic resin such as a polyimide resin, a resin in which the thermosetting resin or the thermoplastic resin is impregnated together with an inorganic filler in a core material such as a glass fiber (a glass, a fabric, glass cloth, or a glass fabric), for example, prepreg, Ajinomoto Build up Film (ABF), FR-4, Bismaleimide Triazine (BT), or the like, may be used as the insulating material. However, the insulating material is not limited thereto.

The redistribution layers 112a and 112b may serve to redistribute the connection pads 122 of the semiconductor chip 120, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a and 112b. The redistribution layers 112a and 112b may have various functions depending on designs of layers corresponding thereto. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, connection terminal pads, and the like.

A surface treatment layer P may further be formed on some of patterns of the redistribution layer 112b exposed from the redistribution layers 112a and 112b through openings formed in the encapsulant 130, if necessary. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. In a case in which the surface treatment layer P is formed in the present disclosure, the redistribution layer 112b may be considered as the concept including the surface treatment layer P.

The vias 113 may electrically connect the redistribution layers 112a and 112b formed on different layers to each other, resulting in an electrical path in the first interconnection member 110. A conductive material may also be used as a material of each of the vias 113. Each of the vias 113 may be entirely filled with a conductive material and may have an hourglass cross-sectional shape, but is not limited thereto. The vias 113 may be formed simultaneously with via pads of the redistribution layers 112a and 112b to thus be integrated with the via pads without having a boundary, but are not limited thereto.

The semiconductor chip 120 may be an integrated circuit (IC) provided in an amount of several hundreds to several millions of elements or more integrated in a single chip. The IC may be, for example, an application processor chip such as a central processor (for example, a CPU), a graphic processor (for example, a GPU), a digital signal processor, a cryptographic processor, a microprocessor, a microcontroller, or the like, but is not limited thereto. The semiconductor chip 120 may include a body 121, the connection pads 122 disposed on the active surface of the body 121, a first passivation layer 123 disposed on the active surface of the body 121 and covering at least portions of the connection pads 122 and exposing at least portions of the connection pads 122, a second passivation layer 124 disposed on the first passivation layer 123 and exposing at least portions of the connection pads 122, and the protrusion bumps 125 disposed on the exposed connection pads 122 and extended to the second passivation layer 124.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components, and a conductive material such as aluminum (Al), or the like, may be used as a material of each of the connection pads 122. The first passivation layer 123 may be an oxide film, a nitride film, or the like, or be a double layer including an oxide film and a nitride film. The second passivation layer 124 may be a known photosensitive insulating layer such as photosensitive polyimide (PSPI). The protrusion bump 125 may include a seed layer formed of titanium (Ti), or the like, and a conductor layer formed of copper (Cu). The active surface of the semiconductor chip 120 may have a step with respect to the second interconnection member 140 by the protrusion bumps 125. Fine pitches of the connection pads 122 may be promoted by the protrusion bumps 125.

The encapsulant 130 may protect the first interconnection member 110 or the semiconductor chip 120. An encapsulation form of the encapsulant 130 is not particularly limited, but may be a form in which the encapsulant 130 surrounds at least portions of the first interconnection member 110 or the semiconductor chip 120. For example, the encapsulant 130 may cover the first interconnection member 110 and the inactive surface of the semiconductor chip 120, and fill spaces between walls of the through-hole 110H and the side surfaces of the semiconductor chip 120. In addition, the encapsulant 130 may also fill at least a portion of a space between the first passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on materials of the encapsulant 130.

The materials of the encapsulant 130 are not particularly limited. For example, an insulating material may be used as the material of the encapsulant 130. In this case, a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like, may be used as the insulating material. In a case in which the encapsulant 130 includes an inorganic filler, the encapsulant 130 may alleviate (thermal or mechanical) impact of corner portions of upper and lower surfaces of the first interconnection member 110 of which reliability is bad and corner portions of the active surface and the inactive surface of the semiconductor chip 120 of which reliability is bad. Alternatively, a material in which a thermosetting resin or a thermoplastic resin is impregnated together with an inorganic filler in a core material such as a glass fiber (or a glass cloth or a glass fabric) may also be used as the insulating material.

The resin layer 135 may be disposed in order to remove the step portions of the protrusion bumps 125 and remove the step portions between the first redistribution layer 112a and the protrusion bumps 125. The resin layer 135 may be disposed to planarize the protrusion bumps 125 disposed on the connection pads 122 of the semiconductor chip 120. Therefore, the step portions of the protrusion bumps 125 may be removed, and the difficulty in forming the fine patterns in the redistribution forming process may thus be solved. In addition, the step portions between the protrusion bumps 125 and the first redistribution layer 112a may also be removed, and even in the case of forming redistributions up to the fan-out region, the difficulty of the fine pattern forming process may be solved. The resin layer 135 may include a known insulating material. For example, the resin layer 135 may be a photosensitive insulating layer. In a case in which the resin layer 135 is the photosensitive insulating layer, an exposure process may be omitted by applying a planarization process, and implementation of fine patterns may be easier.

As a result of the planarization, the resin layer 135 may contact at least portions of the side surfaces of the protrusion bumps 125. In addition, at least portions of the space between the second interconnection member 140 and the active surface of the semiconductor chip 120 may be filled with the resin layer 135 as well as the encapsulant 130. Further, the interface between the second interconnection member 140 and the resin layer 135 and the interface between the second interconnection member 140 and the protrusion bump 125 may be present on the levels corresponding to each other. Further, the resin layer 135 may contact at least portions of the side surfaces of the first redistribution layer 112a. Further, at least portions of the space between the second interconnection member 140 and the insulating layer 111 may be filled with the resin layer 135 as well as the encapsulant 130. Further, the interface between the second interconnection member 140 and the resin layer 135 and the interface between the second interconnection member 140 and the first redistribution layer 112a may also be present on the levels corresponding to each other.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141, redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, but may also include a plurality of layers.

An insulating material may be used as a material of each of the insulating layers 141. In this case, in addition to the insulating material as described above, a photosensitive insulating material such as a PID resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are multiple layers, the insulating layers 141 may be integrated with each other depending on a process, such that a boundary therebetween may also not be apparent.

The redistribution layers 142 may substantially serve to redistribute the connection pads 122, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142. The redistribution layers 142 may have various functions depending on designs of layers corresponding thereto. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

A surface treatment layer (not illustrated) may be formed on surfaces of the pad patterns, or the like, exposed from the redistribution layer 142 of the second interconnection member 140 through openings 151 formed in a passivation layer 150 to be described below, if necessary. The surface treatment layer (not illustrated) is not particularly limited as long as it is known in the related art, but may be formed by, for example, electrolytic gold plating, electroless gold plating, OSP or electroless tin plating, electroless silver plating, electroless nickel plating/substituted gold plating, DIG plating, HASL, or the like. In the case in which the surface treatment layers (not illustrated) are formed, the redistribution layers 142 of the second interconnection member 140 may be considered as the concept including the surface treatment layers in the present disclosure.

The vias 143 may electrically connect the redistribution layers 142, the connection pads 122, or the like, formed on different layers to each other, resulting in an electrical path in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the vias 143. The via 143 may be entirely filled with the conductive material, or the conductive material may also be formed along a wall of the via. In addition, the via 143 may have all shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b formed in the first interconnection member 110 may be formed to be large depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be additionally configured to protect the second interconnection member 140 from external physical or chemical damage. The passivation layer 150 may have the openings 151 exposing at least portions of the redistribution layer 142 of the second interconnection member 140. The number of openings formed in the passivation layer 150 may be several tens to several thousands.

A material of the passivation layer 150 is not particularly limited, but may be a photosensitive insulating material such as a PID resin. Alternatively, a solder resist may also be used as a material of the passivation layer 150. Alternatively, an insulating resin that does not include a core material, but includes a filler, such as ABF including an inorganic filler and an epoxy resin may be used as the material of the passivation layer 150. In a case in which an insulating material that includes an inorganic filler and an insulating resin, but does not include a core material, such as the ABF, or the like, is used as the material of the passivation layer 150, the passivation layer 150 and the resin layer 135 may have a symmetrical effect to each other, and may control warpage dispersion, which may be more effective in controlling warpage. When the insulating material including the inorganic filler and the insulating resin, such as the ABF, or the like, is used as the material of the passivation layer 150, the insulating layer 141 of the second interconnection member 140 may also include an inorganic filler and an insulating resin. In this case, a weight percent of inorganic filler included in the passivation layer 150 may be greater than that of inorganic filler included in the insulating layer 141 of the second interconnection member 140. In this case, the passivation layer 150 may have a relatively low a coefficient of thermal expansion (CTE), which may be more effective in controlling the warpage.

An under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second interconnection member 140 opened through the openings 151 of the passivation layer 150. The under-bump metal layer 160 may be formed in the openings 151 of the passivation layer 150 by a known metallization method using a known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170.

Each of the connection terminals 170 may be formed of a conductive material such as a solder, or the like. However, this is only an example, and a material of each of the connection terminals 170 is not limited thereto. Each of the connection terminals 170 may be a land, a ball, a pin, or the like. The connection terminal 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto.

The number, interval, dispositional form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extended onto one surface of the passivation layer 150, and connection reliability may be more excellent.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Meanwhile, although not illustrated in the drawings, a metal layer may be further disposed on a wall of the through-hole 110H, if necessary. The metal layer may serve to effectively radiate heat generated from the semiconductor chip 120. In addition, the metal layer may also serve to block electromagnetic waves. In addition, a separate passive component such as a capacitor, an inductor, or the like, may be further disposed in the through-hole 110H. In addition, a plurality of semiconductor chips 120 may be disposed in the through-hole 110H. In addition, the number of through-holes 110H may be plural and semiconductor chips 120 or passive components may be disposed in the through-holes 110H, respectively. In addition to the structures described above, the structures known in the related art may be applied.

Figure 11A:
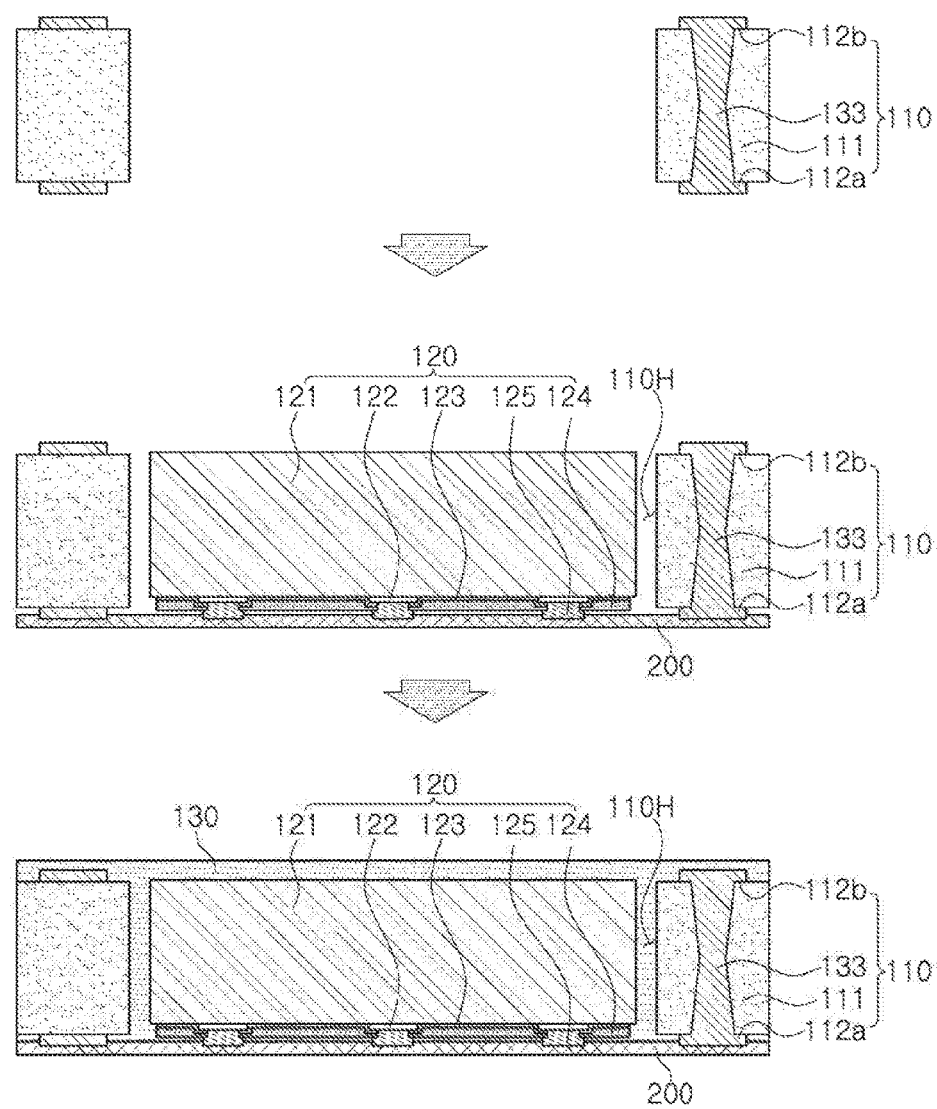
FIGS. 11A through 11C are schematic views illustrating an example of processes of manufacturing the fan-out semiconductor package of FIG. 9.
Figure 11B:
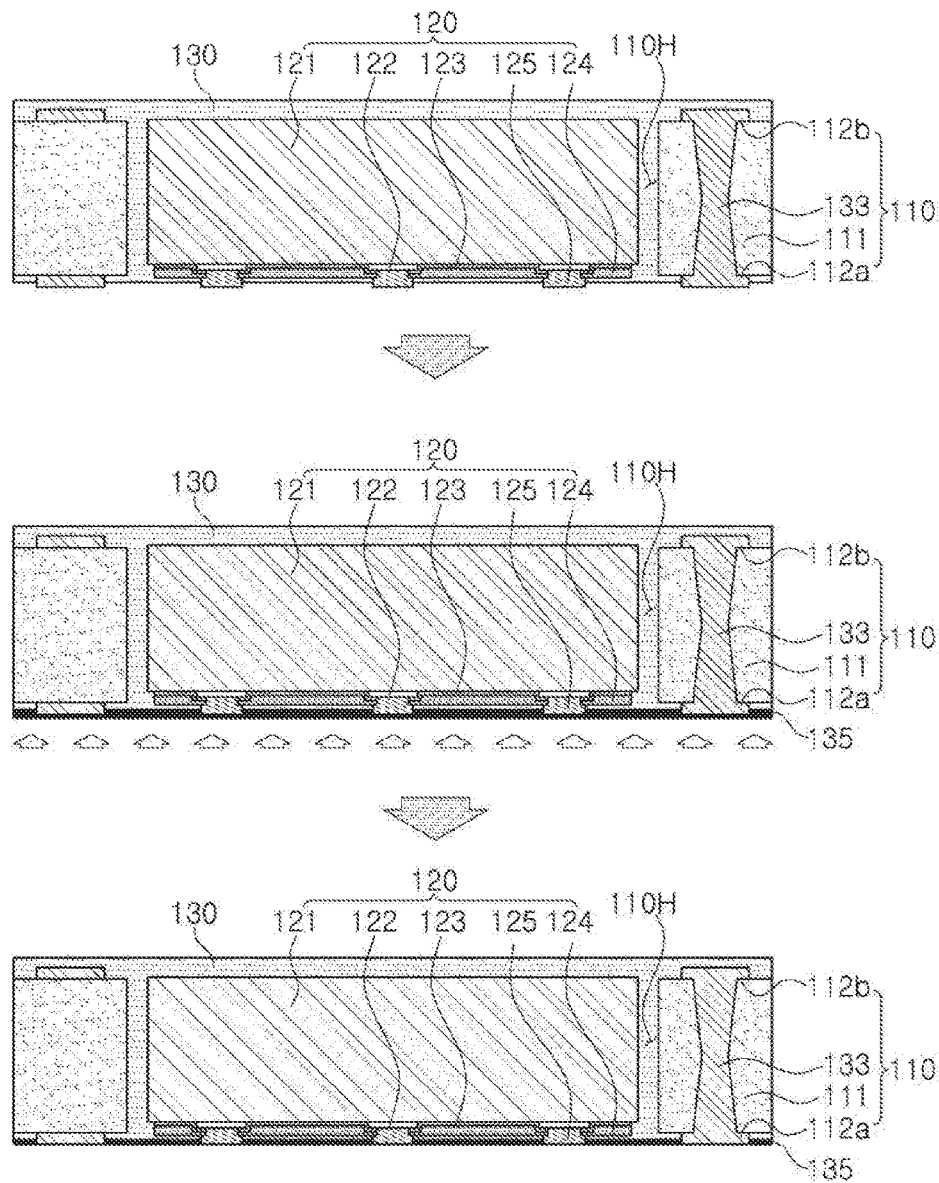
Figure 11C:
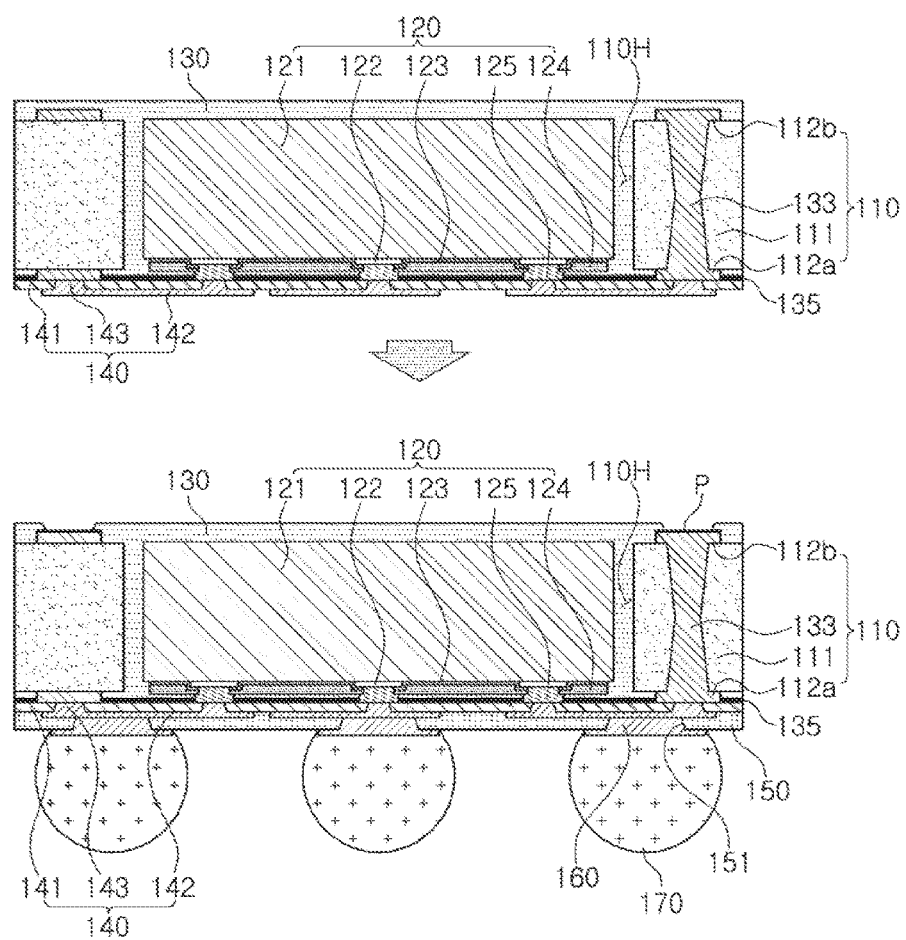

FIGS. 11A through 11C are schematic views illustrating an example of processes of manufacturing the fan-out semiconductor package of FIG. 9.

Referring to FIG. 11A, the first interconnection member 110 may first be prepared. Then, the semiconductor chip 120 may be disposed in the through-hole 110H of the first interconnection member 110 using a temporary film 200 such as an adhesive film, or the like. For example, the first interconnection member 110 may be attached to the temporary film 200, and the semiconductor chip 120 may be attached onto and disposed on the temporary film 200 exposed through the through-hole 110H in a face-down form. Then, the semiconductor chip 120 may be encapsulated using the encapsulant 130. The encapsulant 130 may encapsulate at least the first interconnection member 110 and the inactive surface of the semiconductor chip 120, and may fill a space within the through-hole 110H. The encapsulant 130 may be formed by a known method. For example, the encapsulant 130 may be formed by a method of laminating a precursor of the encapsulant 130 and then hardening the precursor. Alternatively, the encapsulant 130 may be formed by a method of applying a pre-encapsulant onto the temporary film 200 to encapsulate the semiconductor chip 120 and then hardening the pre-encapsulant.

Referring to FIG. 11B, the temporary film 200 may be removed. Then, the resin layer 135 may be formed in a region in which the temporary film 200 is removed. The resin layer 135 may be formed by a known method such as a lamination method, an applying method, or the like. After the resin layer 135 is hardened, a surface planarization process may be performed. Therefore, the step portions of the protrusion bumps 125 and the step portions of the first redistribution layer 112a may be removed. Therefore, fine patterns may be formed when a redistribution process is performed. An exposure process of the resin layer 135 may be omitted due to the surface planarization process.

Referring to FIG. 11C, the second interconnection member 140 may be formed on the resin layer 135 using a fine semiconductor process, or the like. The second interconnection member 140 may be formed by forming the insulating layers 141 and then forming the redistribution layers 142 and the vias 143. The passivation layer 150 may be formed on the second interconnection member 140 using a lamination method, or the like, if necessary. In addition, the openings may be formed in the encapsulant 130. In addition, the openings 151 may be formed in the passivation layer 150 by a known method, the under-bump metal layer 160 may be formed on the openings 151, and the connection terminals 170 may be formed on the under-bump metal layer 160.

Figure 12:
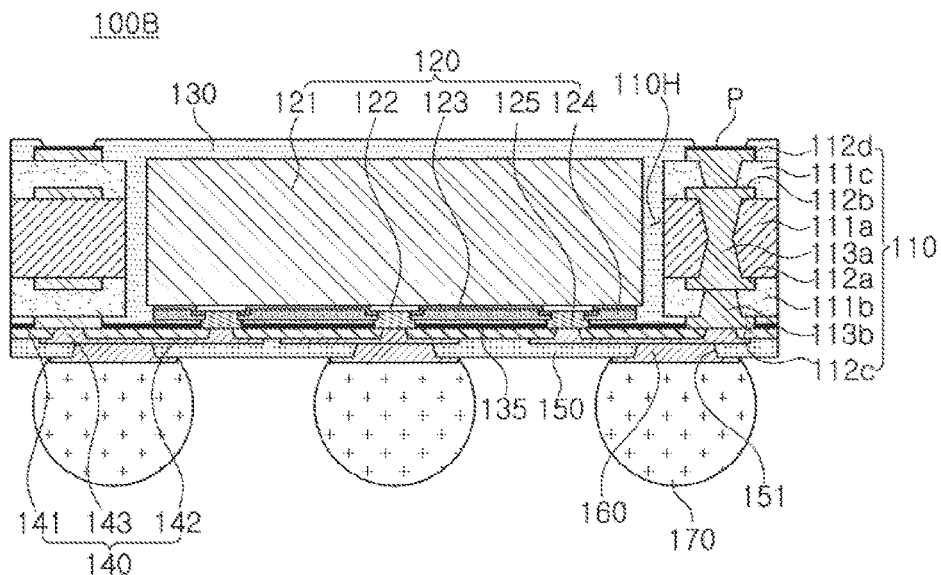
FIG. 12 is a schematic cross-sectional view illustrating a modified example of the fan-out semiconductor package of FIGS. 11A through 11C.

FIG. 12 is a schematic cross-sectional view illustrating a modified example of the fan-out semiconductor package of FIGS. 11A through 11C.

Referring to the drawing, in a fan-out semiconductor package 100B according to a modified example, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b and contacting a second interconnection member 140, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, the second interconnection member 140 may be further simplified. Therefore, a decrease in a yield depending on a defect occurring in a process of forming the second interconnection member 140 may be improved. The first to fourth redistribution layers 112a, 112b, 112c, and 112d may be electrically connected to each other by first to third vias 113a, 113b, and 113c each penetrating through the first to third insulating layers 111a, 111b, and 111c.

A resin layer 135 may contact at least portions of side surfaces of the third redistribution layer 112c. At least portions of a space between the second interconnection member 140 and the second insulating layer 111b may be filled with the resin layer 135 as well as an encapsulant 130. An interface between the second interconnection member 140 and the resin layer 135 and an interface between the second interconnection member 140 and the third redistribution layer 112c may be present on levels corresponding to each other. As described above, the resin layer 135 may be disposed, such that planarization is possible. Therefore, fine patterns may be easily formed in a redistribution process, which is a subsequent process.

The first insulating layer 111a may have a thickness greater than those of the second insulating layer 111b and the third insulating layer 111c. The first insulating layer 111a may basically be relatively thick in order to maintain rigidity, and the second insulating layer 111b and the third insulating layer 111c may be disposed in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

The first redistribution layer 112a and the second redistribution layer 112b of the first interconnection member 110 may be disposed on a level between an active surface and an inactive surface of the semiconductor chip 120. The first interconnection member 110 may be formed to a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120. Thicknesses of the redistribution layers 112a, 112b, 112c, and 112d of the first interconnection member 110 may be greater than those of redistribution layers 142 of the second interconnection member 140. Since the first interconnection member 110 may have a thickness equal to or greater than that of the semiconductor chip 120, the redistribution layers 112a, 112b, 112c, and 112d may also be formed to be large, and the redistribution layers 142 of the second interconnection member 140 may be formed at a small size for thinness.

A description, or the like, of configurations other than the abovementioned configuration may overlap the description provided above, and is thus omitted.

Figure 13:
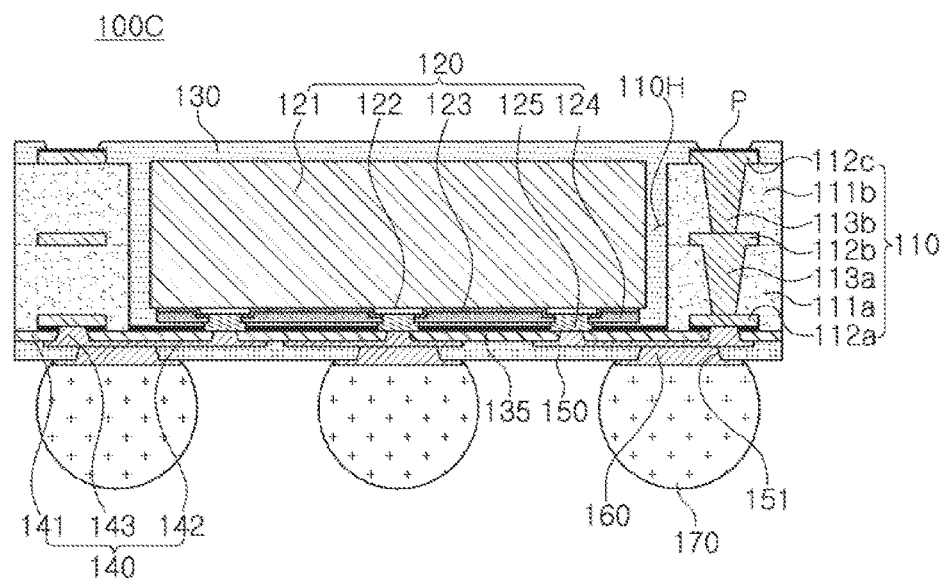
FIG. 13 is a schematic cross-sectional view illustrating a modified example of the fan-out semiconductor package of FIGS. 11A through 11C.

FIG. 13 is a schematic cross-sectional view illustrating a modified example of the fan-out semiconductor package of FIG. 11A through 11C.

Referring to the drawing, in a fan-out semiconductor package 100C according to another modified example, a first interconnection member 110 may include a first insulating layer 111a, a first redistribution layer 112a embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively.

A resin layer 135 may contact at least portions of the embedded first redistribution layer 112a. An interface between a second interconnection member 140 and the resin layer 135 and an interface between the second interconnection member 140 and the first insulating layer 111a may be present on levels corresponding to each other. As described above, also in a case in which the first interconnection member 110 has embedded patterns, the resin layer 135 may be disposed, such that planarization is possible. Therefore, fine patterns may be easily formed in a redistribution process, which is a subsequent process.

Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved. The first redistribution layer 112a may be recessed in the first insulating layer 111a, such that a lower surface of the first insulating layer 111a may have a step with respect to a lower surface of the first redistribution layer 112a. Resultantly, when an encapsulant 130 is formed, a phenomenon that a material of the encapsulant 130 is bled to pollute the first redistribution layer 112a may be prevented.

The second redistribution layer 112b of the first interconnection member 110 may be disposed on a level between an active surface and an inactive surface of a semiconductor chip 120. The first interconnection member 110 may be formed to a thickness corresponding to that of the semiconductor chip 120. Therefore, the second redistribution layer 112b formed in the first interconnection member 110 may be disposed on a level between the active surface and the inactive surface of the semiconductor chip 120. Thicknesses of the redistribution layers 112a, 112b, and 112c of the first interconnection member 110 may be greater than those of redistribution layers 142 of the second interconnection member 140. Since the first interconnection member 110 may have a thickness equal to or greater than that of the semiconductor chip 120, the redistribution layers 112a, 112b, and 112c may be formed to be large depending on a scale of the first interconnection member 110. On the other hand, the redistribution layers 142 of the second interconnection member 140 may be formed to be relatively small for thinness.

A description, or the like, of configurations other than the abovementioned configuration may overlap the description provided above, and is thus omitted.

Figure 14:
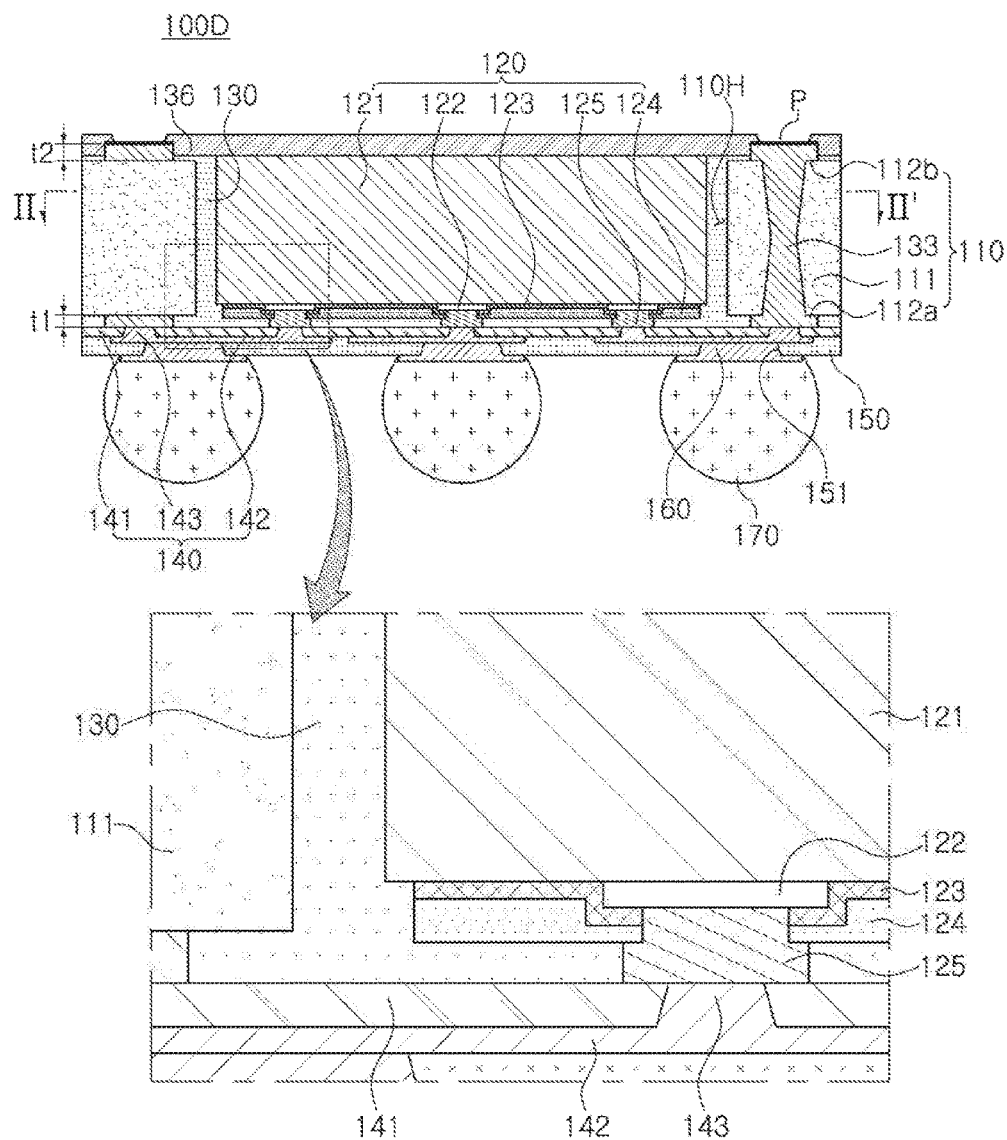
FIG. 14 is a schematic cross-sectional view illustrating another example of a fan-out semiconductor package.

FIG. 14 is a schematic cross-sectional view illustrating another example of a fan-out semiconductor package.

Figure 15:
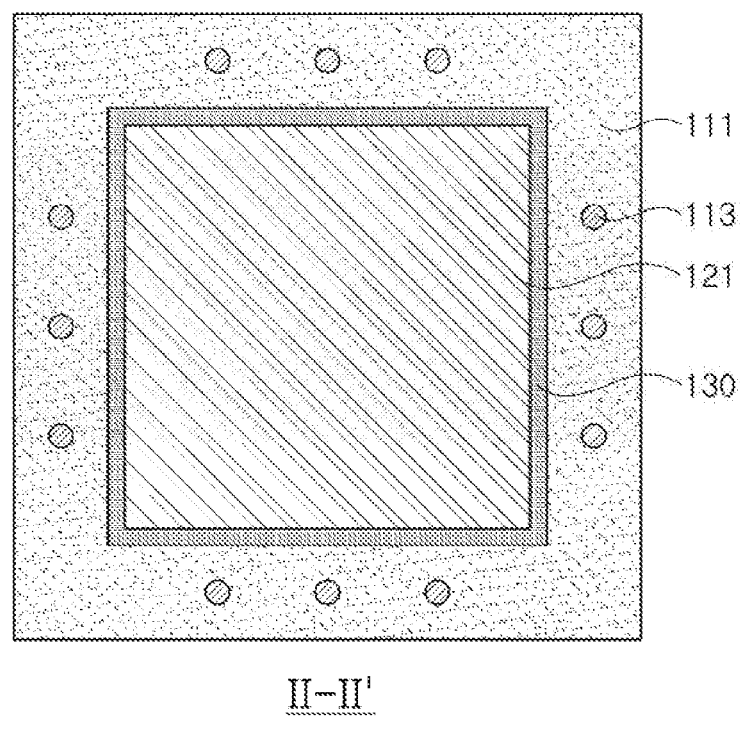
FIG. 15 is a schematic plan view taken along line II-II' of the fan-out semiconductor package of FIG. 14.

FIG. 15 is a schematic plan view taken along line I-I' of the fan-out semiconductor package of FIG. 14.

Referring to the drawings, a fan-out semiconductor package 100D according to another exemplary embodiment in the present disclosure may include a first interconnection member 110 having a through-hole 110H, a semiconductor chip 120 disposed in the through-hole 110H of the first interconnection member 110, having an active surface having connection pads 122 disposed thereon and an inactive surface disposed to oppose the active surface, and having protrusion bumps 125 disposed on the connection pads 122, an encapsulant 130 encapsulating at least portions of the first interconnection member 110 and side surfaces of the semiconductor chip 120, a second interconnection member 140 disposed on the first interconnection member 110 and the active surface of the semiconductor chip 120 and having redistribution layers 142 electrically connected to the connection pads 122 of the semiconductor chip 120, and a cover layer 136 disposed on the encapsulant 130 and covering the inactive surface of the semiconductor chip 120. The first interconnection member 110 may include a first redistribution layer 112a contacting the second interconnection member 140 and a second redistribution layer 112b contacting the cover layer 136. The first and second redistribution layers 112a and 112b may be electrically connected to the connection pads 122. The first redistribution layer 112a may have a thickness smaller than that of the second redistribution layer 112b.

In the fan-out semiconductor package 100D according to another exemplary embodiment, the cover layer 136 may be disposed on the encapsulant 130 encapsulating the semiconductor chip 120. In addition, a thickness t1 of the first redistribution layer 112a may be lower than a thickness t2 of the second redistribution layer 112b. Here, a portion of the first redistribution layer 112a may be removed as a result of a planarization process such as a process to be described below. In addition, the cover layer 136 may be disposed in face-up form for the purpose of the planarization process to cover portions that are not encapsulated by the encapsulant 130. As described above, step portions of the protrusion bumps 125 may be removed due to the structural characteristics derived by the planarization process, and difficulty in forming fine patterns in a redistribution forming process may thus be solved. In addition, as a result of the planarization, an interface between the second interconnection member 140 and the first redistribution layer 112a and an interface between the second interconnection member 140 and the protrusion bump 125 may be present on levels corresponding to each other. Therefore, difficulty in forming fine patterns in a fan-out region may also be solved.

Meanwhile, the cover layer 136 may be formed of a material similar to that of the encapsulant 130. For example, an insulating material may be used as the material of the cover layer 136. In this case, a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like, may be used as the insulating material. Alternatively, a material in which a thermosetting resin or a thermoplastic resin is impregnated together with an inorganic filler in a core material such as a glass fiber (or a glass cloth or a glass fabric) may also be used as the insulating material.

A description, or the like, of configurations other than the abovementioned configuration may overlap the description provided above, and is thus omitted.

Figure 16A:
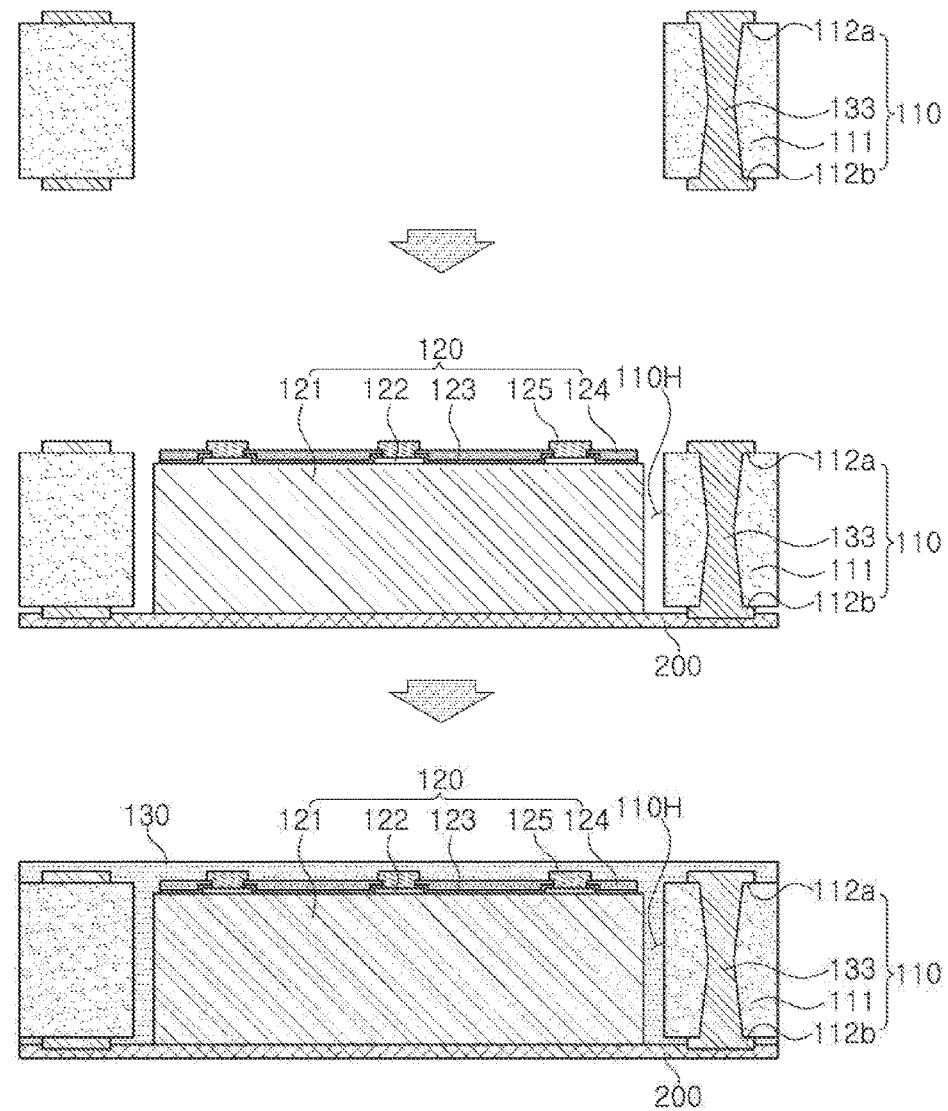
FIGS. 16A through 16C are schematic views illustrating an example of processes of manufacturing the fan-out semiconductor package of FIG. 14.
Figure 16B:
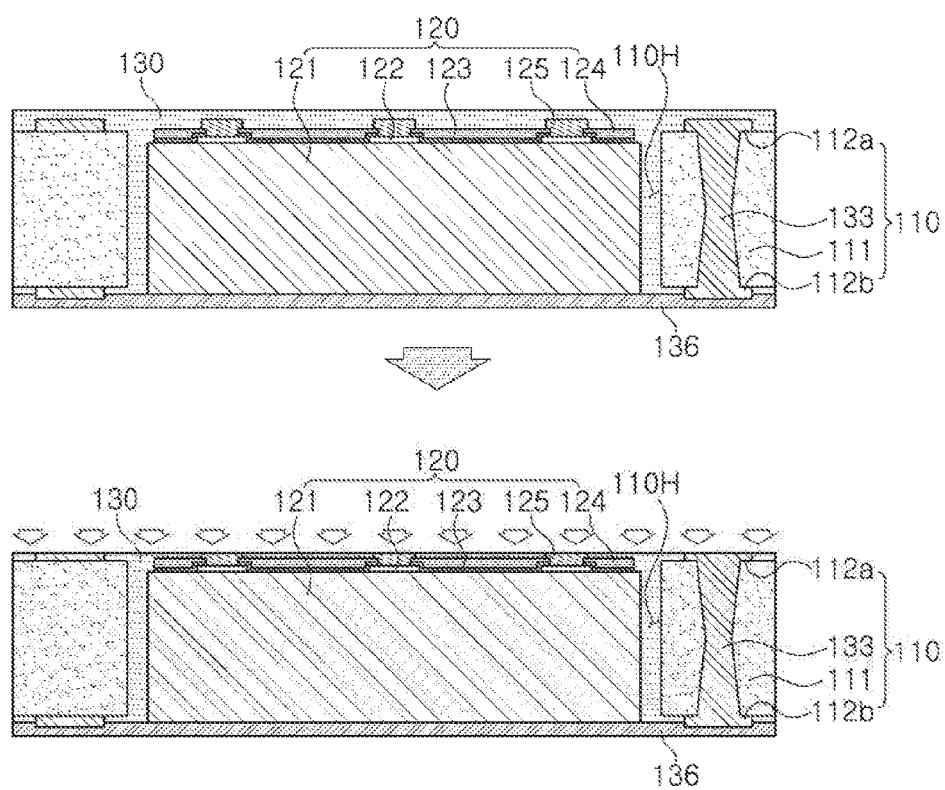
Figure 16C:
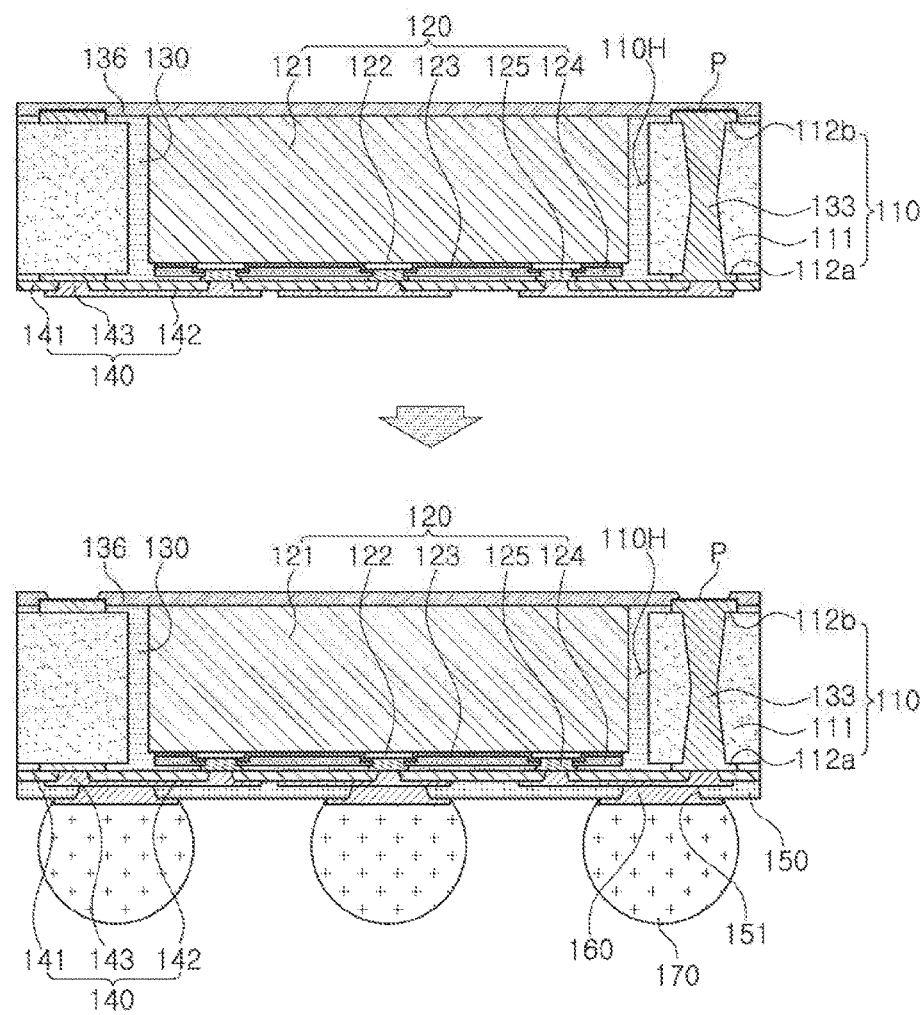

FIGS. 16A through 16C are schematic views illustrating an example of processes of manufacturing the fan-out semiconductor package of FIG. 14.

Referring to FIG. 16A, the first interconnection member 110 may first be prepared. Then, the semiconductor chip 120 may be disposed in the through-hole 110H of the first interconnection member 110 using a temporary film 200 such as an adhesive film, or the like. For example, the first interconnection member 110 may be attached to the temporary film 200, and the semiconductor chip 120 may be attached onto and disposed on the temporary film 200 exposed through the through-hole 110H in face-up form. Then, the semiconductor chip 120 may be encapsulated using the encapsulant 130. The encapsulant 130 may encapsulate at least the first interconnection member 110 and the active surface of the semiconductor chip 120, and may fill a space within the through-hole 110H. The encapsulant 130 may be formed by a known method. For example, the encapsulant 130 may be formed by a method of laminating a precursor of the encapsulant 130 and then hardening the precursor. Alternatively, the encapsulant 130 may be formed by a method of applying a pre-encapsulant to the temporary film 200 to encapsulate the semiconductor chip 120 and then hardening the pre-encapsulant.

Referring to FIG. 16B, the temporary film 200 may be removed. Then, the cover layer 136 may be formed in a region from which the temporary film 200 has been removed. The cover layer 136 may be formed by a known method such as a lamination method, an applying method, or the like. After the cover layer 136 is hardened, a surface planarization process may be performed. Therefore, the step portions of the protrusion bumps 125 and the step portions of the first redistribution layer 112a may be removed. Therefore, fine patterns may be formed when a redistribution process is performed. In this case, a portion of the first redistribution layer 112a may be removed, and a thickness t1 of the first redistribution layer 112a may thus be smaller than a thickness t2 of the second redistribution layer 112b.

Referring to FIG. 16C, the second interconnection member 140 may be formed on the first interconnection member 110 and the active surface of the semiconductor chip 120 using a fine semiconductor process, or the like. The second interconnection member 140 may be formed by forming the insulating layers 141 and then forming the redistribution layers 142 and the vias 143. The passivation layer 150 may be formed on the second interconnection member 140 using a lamination method, or the like, if necessary. In addition, openings may be formed in the cover layer 136. In addition, the openings 151 may be formed in the passivation layer 150 by a known method, the under-bump metal layer 160 may be formed on the openings 151, and the connection terminals 170 may be formed on the under-bump metal layer 160.

A description, or the like, of configurations other than the abovementioned configuration may overlap the description provided above, and is thus omitted.

Figure 17:
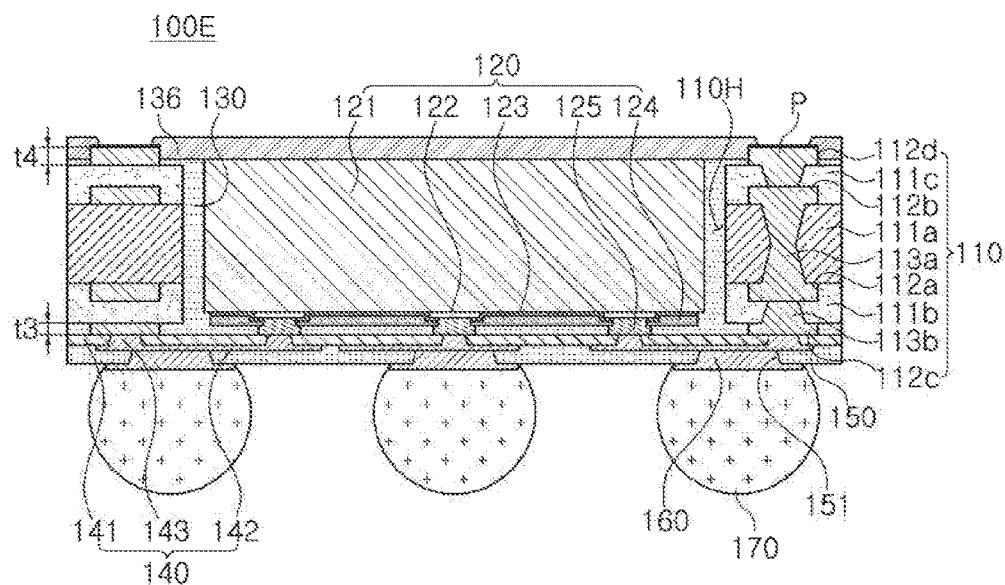
FIG. 17 is a schematic cross-sectional view illustrating a modified example of the fan-out semiconductor package of FIG. 14.

FIG. 17 is a schematic cross-sectional view illustrating a modified example of the fan-out semiconductor package of FIG. 14.

Referring to the drawing, in a fan-out semiconductor package 100E according to a modified example, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b and contacting a second interconnection member 140, a third insulating layer 111c disposed on the first insulating layer 111a and covering the second redistribution layer 112b, and a fourth redistribution layer 112d disposed on the third insulating layer 111c and contacting a cover layer 136. The first to fourth redistribution layers 112a, 112b, 112c, and 112d may be electrically connected to connection pads 122. The first to fourth redistribution layers 112a, 112b, 112c, and 112d may be electrically connected to each other by first to third vias 113a, 113b, and 113c each penetrating through the first to third insulating layers 111a, 111b, and 111c. Similarly, a thickness t3 of the third redistribution layer 112c may be greater than a thickness t4 of the fourth redistribution layer 112d.

A description, or the like, of configurations other than the abovementioned configuration overlaps those described above, and is thus omitted.

Figure 18:
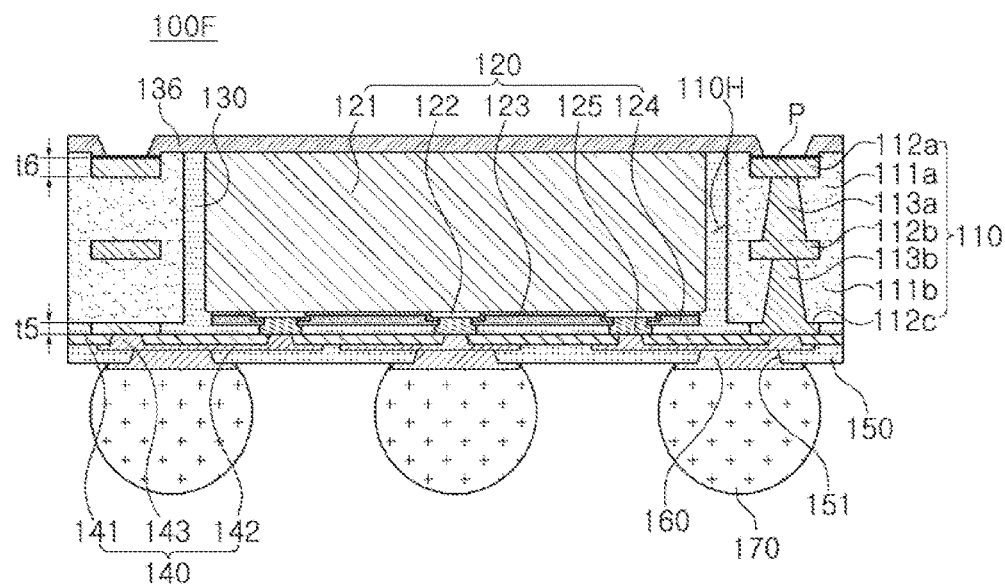
FIG. 18 is a schematic cross-sectional view illustrating a modified example of the fan-out semiconductor package of FIG. 14.

FIG. 18 is a schematic cross-sectional view illustrating a modified example of the fan-out semiconductor package of FIG. 14.

Referring to the drawing, in a fan-out semiconductor package 100F according to another modified example, a first interconnection member 110 may include a first insulating layer 111a, a first redistribution layer 112a disposed on the first insulating layer 111a and contacting a cover layer 136, a second redistribution layer 112b embedded in the other surface of the first insulating layer 111a opposing one surface of the first insulating layer 111a on which the first redistribution layer 112a is disposed, a second insulating layer 111b disposed on the other surface of the first insulating layer 111a in which the second redistribution layer 112b is embedded, and a third redistribution layer 112c embedded in the other surface of the second insulating layer 111b opposing one surface of the second insulating layer 111b on which the second redistribution layer 112b is disposed and contacting a second interconnection member 140. The first to third redistribution layers 112a, 112b, and 112c may be electrically connected to connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively. Similarly, a thickness t5 of the first redistribution layer 112a may be greater than a thickness t6 of the third redistribution layer 112c.

A description, or the like, of configurations other than the abovementioned configuration overlaps those described above, and is thus omitted.

As set forth above, according to the exemplary embodiment in the present disclosure, a fan-out semiconductor package in which implementation of fine patterns is facilitated may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a semiconductor chip disposed in the through-hole, having an active surface having a connection pad disposed thereon and an inactive surface opposing the active surface, and having a protrusion bump disposed on the connection pad;
an encapsulant encapsulating at least portions of the first interconnection member and the inactive surface of the semiconductor chip;
a second interconnection member disposed on the first interconnection member and the active surface of the semiconductor chip; and
a resin layer disposed between the encapsulant and the second interconnection member and contacting at least portions of side surfaces of the protrusion bump,
wherein the first interconnection member and the second interconnection member respectively include redistribution layers electrically connected to the connection pad,
the first interconnection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer and contacting the second interconnection member, and
the resin layer contacts at least portions of side surfaces of the third redistribution layer.

2. The fan-out semiconductor package of claim 1, wherein an interface between the second interconnection member and the resin layer is substantially at the same level as an interface between the second interconnection member and the protrusion bump.

3. The fan-out semiconductor package of claim 1, wherein an interface between the second interconnection member and the resin layer is substantially at the same level as an interface between the second interconnection member and the third redistribution layer.

4. The fan-out semiconductor package of claim 1, wherein the first interconnection member further includes a third insulating layer disposed on the first insulating layer and covering the second redistribution layer and a fourth redistribution layer disposed on the third insulating layer.

5. The fan-out semiconductor package of claim 1, wherein the first insulating layer has a thickness greater than that of the second insulating layer.

6. The fan-out semiconductor package of claim 1, wherein the first redistribution layer is disposed on a level between the active surface and the inactive surface of the semiconductor chip.

7. The fan-out semiconductor package of claim 1, wherein the first interconnection member includes a first insulating layer, a first redistribution layer embedded in a first surface of the first insulating layer, and a second redistribution layer disposed on a second surface of the first insulating layer opposing the first surface of the first insulating layer, and
the resin layer contacts at least portions of the embedded first redistribution layer.

8. The fan-out semiconductor package of claim 7, wherein an interface between the second interconnection member and the resin layer is substantially at the same level as an interface between the second interconnection member and the first insulating layer.

9. The fan-out semiconductor package of claim 7, wherein the first interconnection member further includes a second insulating layer disposed on the first insulating layer and covering the second redistribution layer and a third redistribution layer disposed on the second insulating layer.

10. The fan-out semiconductor package of claim 9, wherein the second redistribution layer is disposed on a level between the active surface and the inactive surface of the semiconductor chip.

11. A fan-out semiconductor package comprising:
a first interconnection member having a through-hole;
a semiconductor chip disposed in the through-hole, having an active surface having a connection pad disposed thereon and an inactive surface opposing the active surface, and having a protrusion bump disposed on the connection pad;
an encapsulant encapsulating at least portions of the first interconnection member and side surfaces of the semiconductor chip;
a second interconnection member disposed on the first interconnection member and the active surface of the semiconductor chip and having a redistribution layer electrically connected to the connection pad of the semiconductor chip; and a cover layer disposed on the encapsulant and covering the inactive surface of the semiconductor chip, wherein the first interconnection member includes a first redistribution layer contacting the second interconnection member and a second redistribution layer contacting the cover layer, the first redistribution layer and the second redistribution layer are electrically connected to the connection pad of the semiconductor chip, and the first redistribution layer has a thickness smaller than that of the second redistribution layer.

12. The fan-out semiconductor package of claim 11, wherein an interface between the second interconnection member and the first redistribution layer is substantially at the same level as an interface between the second interconnection member and the protrusion bump.

* * * * *